US010923550B2

(12) United States Patent
Naganuma

(10) Patent No.: US 10,923,550 B2
(45) Date of Patent: Feb. 16, 2021

(54) DISPLAY DEVICE WITH ORGANIC LAYER WITH DIFFERENT THICKNESS

(71) Applicant: Japan Display Inc., Tokyo (JP)

(72) Inventor: Tomohiko Naganuma, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/114,301

(22) Filed: Aug. 28, 2018

(65) Prior Publication Data

US 2019/0081126 A1 Mar. 14, 2019

(30) Foreign Application Priority Data

Sep. 8, 2017 (JP) .................................. 2017-172979

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ........ *H01L 27/3276* (2013.01); *H01L 27/326* (2013.01); *H01L 27/3258* (2013.01); *H01L 51/0097* (2013.01); *H01L 51/5253* (2013.01); *H01L 51/56* (2013.01); *H01L 2227/323* (2013.01); *H01L 2251/301* (2013.01); *H01L 2251/5338* (2013.01); *H01L 2251/558* (2013.01)

(58) Field of Classification Search
CPC ......................... H01L 27/3276; H01L 27/3258
See application file for complete search history.

(56) References Cited

U.S. PATENT DOCUMENTS

| 6,078,016 A | * | 6/2000 | Yoshikawa | ......... G01P 15/0802 200/181 |
| 2003/0094615 A1 | * | 5/2003 | Yamazaki | ............... H01L 27/12 257/72 |
| 2011/0171764 A1 | * | 7/2011 | Toonen | .................. B82Y 20/00 438/29 |
| 2015/0311409 A1 | * | 10/2015 | Huang | .................. G02F 1/1362 257/99 |
| 2016/0064691 A1 | * | 3/2016 | Lee | ..................... H01L 27/3248 257/40 |

(Continued)

FOREIGN PATENT DOCUMENTS

JP 2001-255513 A 9/2001

*Primary Examiner* — Lex H Malsawma
*Assistant Examiner* — Laura M Dykes
(74) *Attorney, Agent, or Firm* — Michael Best & Friedrich LLP

(57) ABSTRACT

A display device includes a display region including a plurality of first regions, and a plurality of second regions arranged with a certain gap between the plurality of first regions, wherein each of the plurality of first regions includes a transistor, a first organic layer, a wiring, a first organic insulating layer on the wiring and the transistor, a display element on the first organic insulating layer, a first sealing layer on the display element and stacked in order with a first inorganic insulating layer, a second organic insulating layer and a second inorganic insulating layer, each of the plurality of second regions includes the wiring, a second organic layer on the wiring, a second sealing layer stacked in order with the first inorganic insulating layer and the second inorganic insulating layer, and a thickness of the second organic layer is smaller than the thickness of the first organic layer.

13 Claims, 19 Drawing Sheets

(56) References Cited

U.S. PATENT DOCUMENTS

| | | | |
|---|---|---|---|
| 2017/0141180 A1* | 5/2017 | Matsumoto | H01L 51/5228 |
| 2017/0221976 A1* | 8/2017 | Park | H01L 27/3262 |
| 2017/0288168 A1* | 10/2017 | Kim | H01L 51/5253 |
| 2018/0090700 A1* | 3/2018 | Nishinohara | H01L 51/52 |
| 2018/0158887 A1* | 6/2018 | Yun | H01L 51/5265 |

* cited by examiner

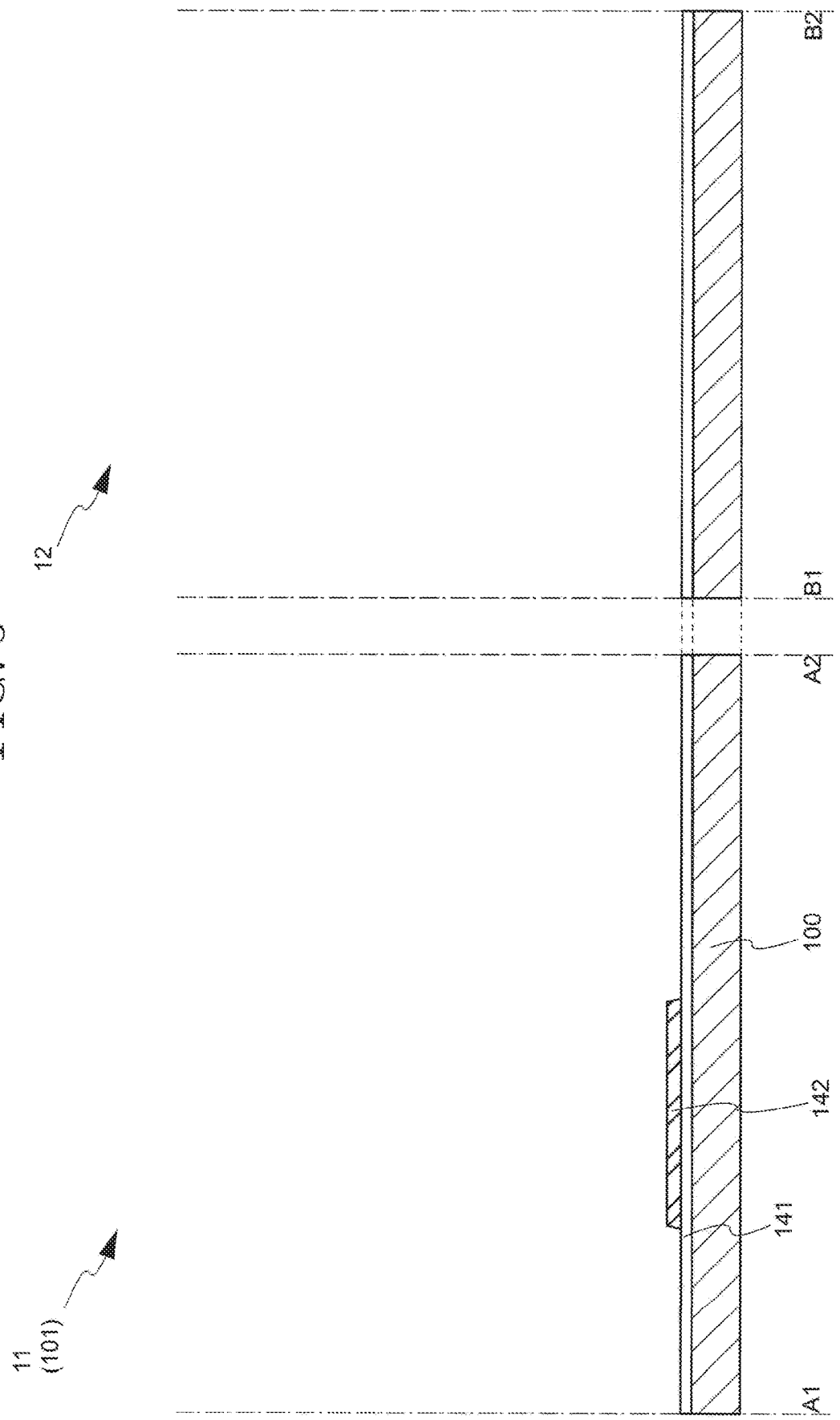

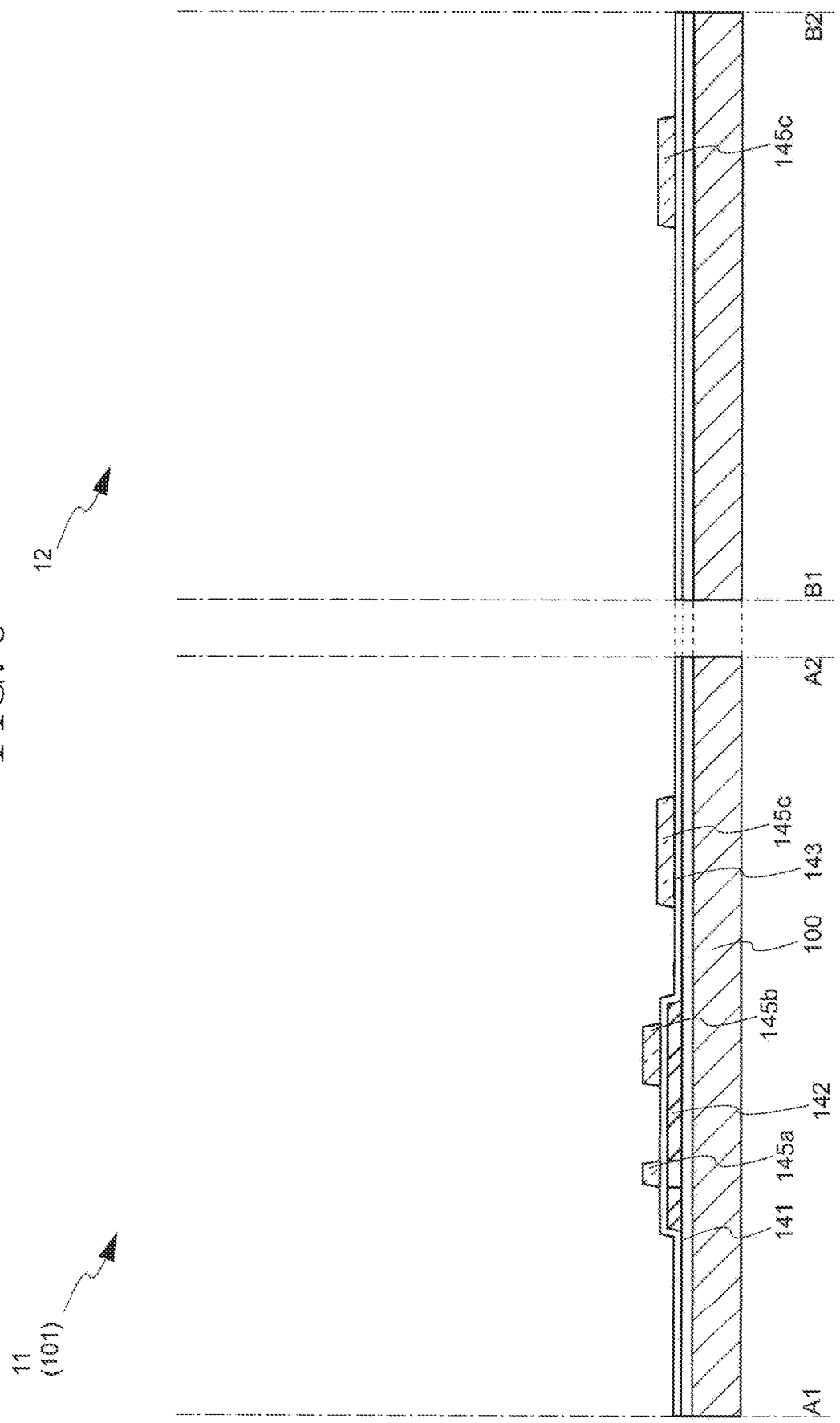

DISPLAY DEVICE WITH ORGANIC LAYER WITH DIFFERENT THICKNESS

CROSS REFERENCE TO RELATED APPLICATIONS

This application is based upon and claims the benefit of priority from the prior Japanese Patent Application No. 2017-172979, filed on Sep. 8, 2017, the entire contents of which are incorporated herein by reference.

FIELD

One embodiment of the present invention is related to a display device.

BACKGROUND

A display device which uses a liquid crystal display element utilizing an electro-optical effect of a liquid crystal or a display which uses an organic electroluminescence (organic EL) element as a display element have been developed and commercialized as a display device used for electric appliances and electronic devices.

In addition, there is a need for a foldable display device in order to reduce the size and weight of the display device. Japanese Laid Open Patent Publication No. 2001-255513 discloses a display device having a folded part (non-display area).

SUMMARY

One embodiment of the present invention is a display device including a display region including a plurality of first regions arranged apart, and a plurality of second regions arranged with a certain gap between the plurality of first regions, wherein each of the plurality of first regions includes a transistor, a first organic layer on the transistor, a wiring, a first organic insulating layer on the wiring and the transistor, a display element on the first organic insulating layer, and a first sealing layer on the display element and stacked in order with a first inorganic insulating layer, a second organic insulating layer and a second inorganic insulating layer, each of the plurality of second regions includes the wiring, a second organic layer on the wiring, a second sealing layer stacked in order with the first inorganic insulating layer and the second inorganic insulating layer, and a thickness of the second organic layer is smaller than the thickness of the first organic layer.

BRIEF EXPLANATION OF THE DRAWINGS

FIG. 5 is a cross-sectional diagram showing the manufacturing method for the display device in an embodiment according to the present invention;

FIG. 6 is a cross-sectional diagram showing the manufacturing method for the display device in an embodiment according to the present invention;

DESCRIPTION OF EMBODIMENTS

Figure 1:
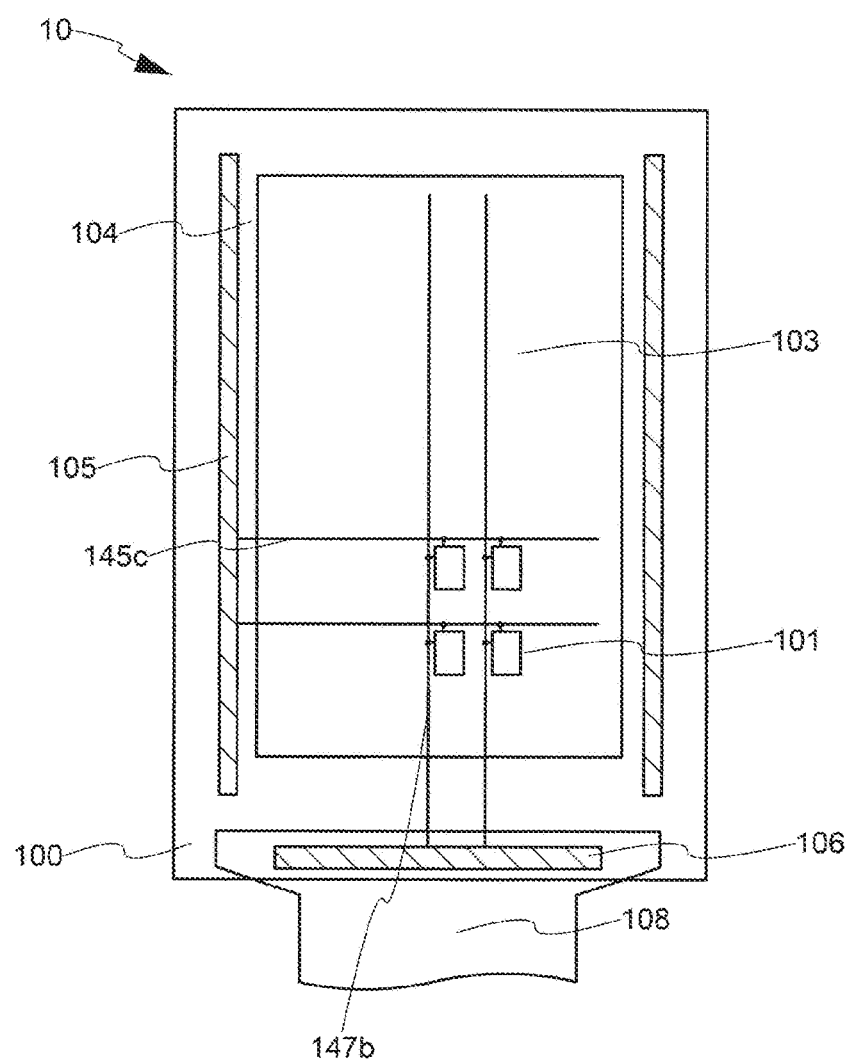
FIG. 1 is a planar view diagram showing a display device in an embodiment according to the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted. The words "first", "second" and the like provided for components are used merely to distinguish the components from each other, and do not have any further meaning unless otherwise specified.

In the specification and the claims, when defining the positional relationship between a component or region and another component or region, an expression that a component or a region is "on" or "under" another component or region encompasses a case where such a component or region is in direct contact with another component or region and also a case where such a component is above or below another component or region, namely, a case where still another component or region is provided between such a component or region and another component or region, unless otherwise specified.

Further, in the present specification, the terms "conductive layer", "electrode" and "wiring" have the same meanings and can be replaced according to the situation.

In the case of Japanese Laid Open Patent Publication No. 2001-255513, it is necessary to remove a support substrate in the non-display region (folded region). Therefore, the manufacturing process may become complicated and manufacturing costs may increase.

In addition, in the case when a folded part is arranged in a display region, a distortion occurs due to bending. As a result, black spots may be generated in the display region or display defects such as breaks in wiring may occur.

One embodiment of the present invention discloses a display device which displays a good image without being affected by folding while simplifying the manufacturing process.

First Embodiment

A display device according to the embodiments of the present invention is shown below. FIG. 1 is a top surface diagram of a display device 10.

(1-1. Structure of Display Device)

In FIG. 1, the display device 10 includes a substrate 100, a display region 103, a periphery part 104, a drive circuit 105, a drive circuit 106 and a flexible printed substrate 108. The drive circuit 105 has a function as a gate driver. The drive circuit 106 has a function as a source driver. A plurality of pixels 101 are arranged apart in a lattice shape in the display region 103. A pixel 101 functions as a component element of the image. Specifically, the pixel 101 includes a display element 130 which is described later. The display element 130 has a function for emitting light. That is, it can be said that the display element 130 is a light emitting region. Therefore, the pixel 101 includes a light emitting region. A scanning line 145c is connected to the drive circuit 105. A signal line 147b is connected to the drive circuit 106. The pixel 101 is connected to the scanning line 145c and the signal line 147b.

In the display device 10, an image signal is input to the drive circuit 106 via the flexible printed substrate 108. Next, the drive circuit 105 and the drive circuit 106 drive the display element 130 (see FIG. 3) within the pixel 101 via the scanning line 145c and the signal line 147b. As a result, a still image and a moving image are displayed in the display region 103. The display region 103 is explained in detail below.

(1-2. Structure of Display Area)

Figure 2:
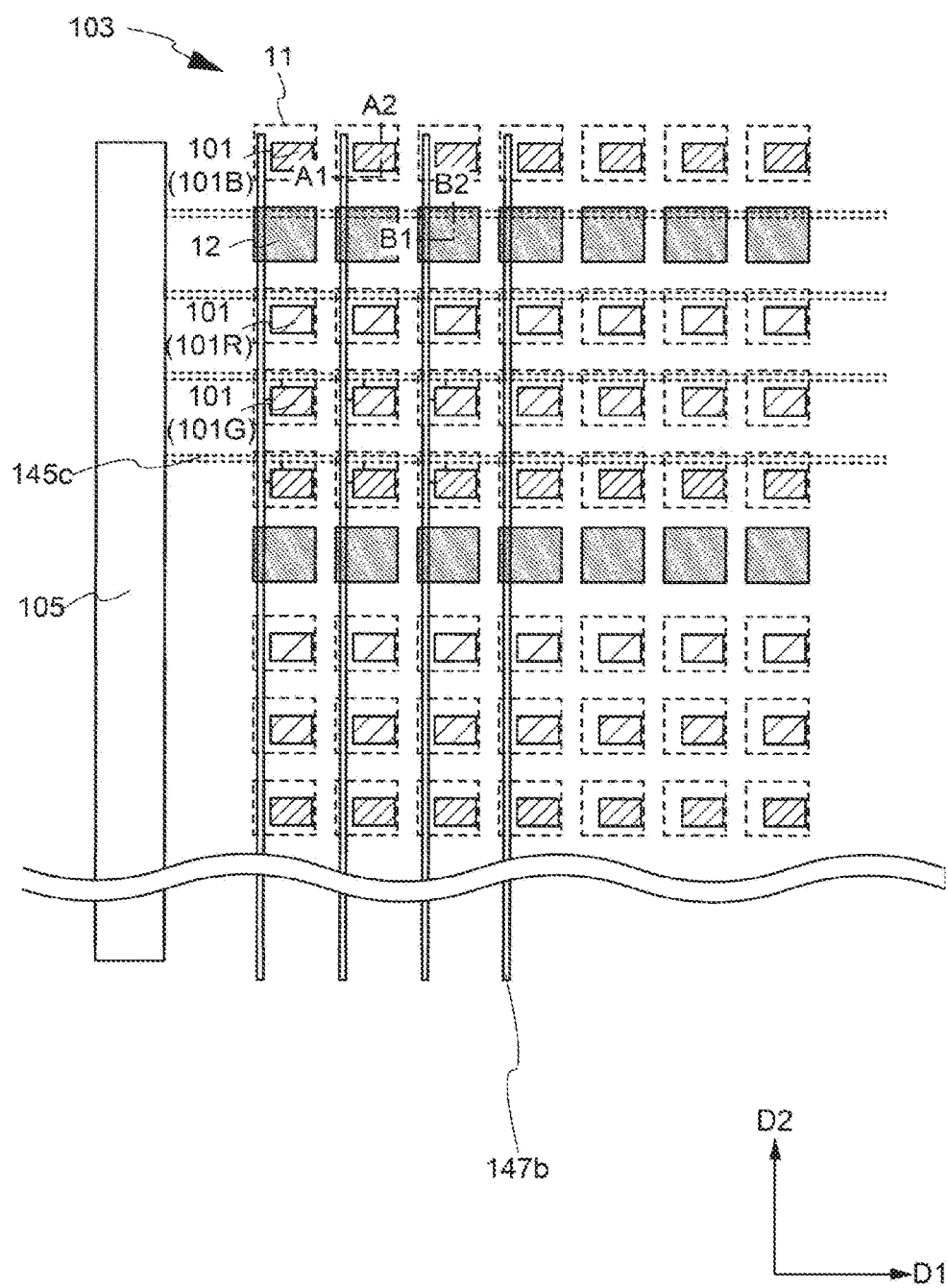
FIG. 2 is a planar view diagram showing a display region in an embodiment according to the present invention.

FIG. 2 is a top surface diagram of the display region 103 of the display device 10. As is shown in FIG. 2, the display region 103 includes a plurality of first regions 11 and a plurality of second regions 12. Each of the plurality of first regions 11 includes a pixel 101. As described above, since the pixel 101 includes the display element 130, that is, a light emitting region, it can be said that the first region 11 includes a light emitting region. A plurality of first regions 11 (pixels 101) are arranged apart in a lattice shape. The pixel 101 includes a pixel 101R which emits red light, a pixel 101G which emits green light and a pixel 101B which emits blue light. In this example, the pixel 101R, the pixel 101G and the pixel 101B are each arranged side by side in the short axis direction (first direction D1) of the display region. In addition, the pixel 101R, the pixel 101G and the pixel 101 B are periodically arranged in this order in the long axis direction (second direction D2) of the display region which intersects the first direction D1. Furthermore, in the case where it is not necessary to separately explain the pixel 101R, the pixel 101G and the pixel 101B, they are explained as the pixel 101.

The second region 12 is arranged between the plurality of first regions 11 (pixels 101). In this example, the second region 12 is arranged between the pixel 101B and the pixel 101R in the first region 11 in the second direction D2. At this time, the second region 12 is arranged along the first direction D1. In addition, the second region 12 is arranged in the second direction D2 similar to the first region 11 (pixel 101). In the description above, it can be said that the second region 12 is arranged with a predetermined gap.

Furthermore, in the description above, the second region 12 does not include the display element 130 unlike the first region 11. As a result, the second region 12 does not emit light. Therefore, it can be said that the second region 12 is a non-light emitting region (also called a dummy pixel region).

(1-3. Cross-Sectional Structure of First Region and Second Region)

Figure 3:
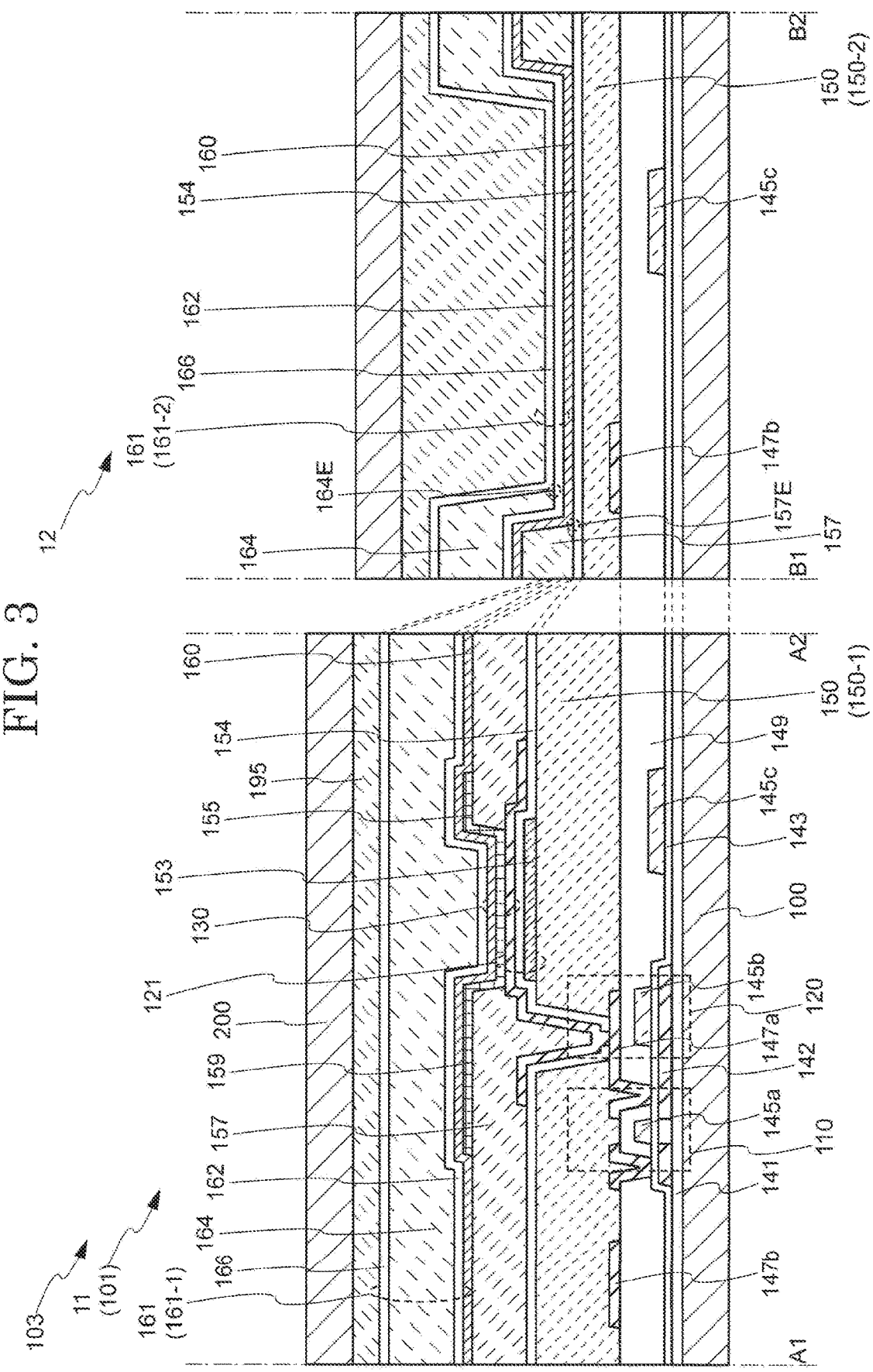
FIG. 3 is a cross-sectional diagram showing the display region in an embodiment according to the present invention.

Next, a cross-sectional structure of the first region 11 (pixel 101) and the second region 12 is explained in detail. FIG. 3 is a cross-sectional view between the line A1-A2 of the first region 11 (pixel 101) and a cross-sectional view between the line B1-B2 of the second region 12 in the display region 103 of the display device 10 shown in FIG. 2. As is shown in FIG. 3, the first region 11 (pixel 101) includes a transistor 110, a capacitor 120, a capacitor 121, a planarization layer 150-1, the display element 130, and wiring such as the scanning line 145c and the signal line 147b, a bank layer 157 and a sealing layer 161-1. The second region 12 includes a planarization layer 150-2, wiring such as the scanning line 145c, the signal line 147b and a sealing layer 161-2. Furthermore, since the second region 12 is arranged between first regions 11, an end part 157E of the bank layer 157 and an end parts 164E of an organic insulating layer 164 may be included on both sides of the second region 12. Furthermore, in addition to the above the display device 10 includes the substrate 100, an insulating layer 141, an insulating layer 149, an adhesive layer 195 and a substrate 200. In the case when it is not necessary to separately explain the planarization layer 150-1 and the planarization layer 150-2, they are explained as the planarization layer 150. In addition, in the case when it is not necessary to separately explain the sealing layer 161-1 and the sealing layer 161-2, they are explained as the sealing layer 161.

The transistor 110 includes a semiconductor layer 142, a gate insulating layer 143, a gate electrode 145a, and a source/drain electrode 147a. Although the transistor 110 has a top gate/top contact structure, it is not limited thereto, and the transistor 110 may have a bottom gate structure or a bottom contact structure.

The source or drain region of the semiconductor layer 142 and the capacitor electrode 145b are used for the capacitor 120 with the gate insulating layer 143 being used as a dielectric. In addition, the conductive layer 153 and the pixel electrode 155 are used for the capacitor 121 with the insulating layer 154 being used as a dielectric.

A pixel electrode 155, an organic EL layer 159 and a counter electrode 160 are used for the display element 130. That is, it can be said that the display element 130 is an organic EL light emitting element. The display element 130 has a so-called top emission type structure in which light emitted from the organic EL layer 159 is radiated to the counter electrode 160 side. Furthermore, the display element 130 is not limited to a top emission type structure and may also be a bottom emission type structure. Furthermore, the counter electrode 160 of the display element 130 is arranged not only in the first region 11 (pixel 101) but also in the second region 12. As a result, a part where the pixel electrode 155, the organic EL layer 159 and the counter electrode 160 overlap (that is, a part which emits light) may be used as the display element 130.

The planarization layer 150 has a function as a planarization film and arranged above the insulating layer 149, the source/drain electrode 147a and the signal line 147b. In the planarization layer 150, the same material may be used for the planarization layer 150-1 arranged in the first region 11 (pixel 101) and the planarization layer 150-2 arranged in the second region 12. On the other hand, the film thickness of the planarization layer 150-1 and the film thickness of the planarization layer 150-2 are different. The film thickness of the planarization layer 150-2 is preferred to be smaller than the film thickness of the planarization layer 150-1. The film thickness of the planarization layer 150-2 is 50% or less and more preferably 40% or less of the film thickness of the planarization layer 150-1. Specifically, the film thickness of the planarization layer 150-2 is preferred to be 1 μm or less.

The planarization layer 150-1 and the planarization layer 150-2 include an organic resin. In this example, an acrylic resin is used for the planarization layer 150-1 and the planarization layer 150-2. Furthermore, the planarization layer 150-1 and the planarization layer 150-2 are not limited to an acrylic resin and an epoxy resin, a polyimide resin, a polyamide resin, a polystyrene resin, a polyethylene resin or a polyethylene terephthalate resin or the like may also be used. In addition, stacked layers including an organic resin and an inorganic material may also be used for the planarization layer 150-1 and the planarization layer 150-2.

The bank layer 157 covers a periphery part of the pixel electrode 155 and also covers an end part of the pixel electrode 155. An organic insulating layer is used for the bank layer 157. For example, an organic resin material such as a polyimide resin is used for the bank layer 157. In addition, in order to increase the contrast ratio of a display image, an organic resin material including a black pigment may be used for the bank layer 157. Although the thickness of the bank layer 157 is not limited, 500 nm or more and 5 μm or less is preferred.

The sealing layer 161 has a function for preventing moisture from entering the display element 130 from the exterior of the display device 10.

The sealing layer 161-1 of the sealing layer 161 is stacked in this order with an inorganic insulating layer 162, an organic insulating layer 164 and an inorganic insulating layer 166. The sealing layer 161-2 is stacked in order with the inorganic insulating layer 162 and the inorganic insulating layer 166. One or more inorganic layers and organic layers may be further included between the inorganic insulating layer 162 and the inorganic insulating layer 166. The sealing layer 161 prevents moisture from entering from the exterior. The inorganic insulating layer 162 and the inorganic insulating layer 166 in the sealing layer 161 prevent the entrance of moisture. An organic insulating layer 164 is arranged between the inorganic insulating layer 162 and the inorganic insulating layer 166. For example, in the case where there is no organic insulating layer 164, holes are sometimes formed in the inorganic insulating layer 162 or the inorganic insulating layer 166 due to particles on the inorganic insulating layer 162. The organic insulating layer 164 covers these particles above the display element 130 and prevents the formation of holes in the inorganic insulating layer 162 and the inorganic insulating layer 166. As a result, the present invention prevents deterioration of the organic EL layer 159 due to moisture.

The film thickness of the inorganic insulating layer 162 and the inorganic insulating layer 166 is not limited, but 50 nm or more and 200 nm or less is preferred. An inorganic material is used for the inorganic insulating layer 162 and the inorganic insulating layer 166. In this example, a silicon nitride film is used for at least one of the inorganic insulating layer 162 and the inorganic insulating layer 166. The silicon nitride film is dense and is suitable for blocking moisture.

The organic insulating layer 164 covers foreign matter which is mixed in during manufacturing. The film thickness of the organic insulating layer 164 is not limited, but 5 μm or more and 20 μm or less is preferred. Furthermore, the same material as the planarization layer 150 is used for the organic insulating layer 164.

In the description above, compared to the first region 11 (the pixel 101), the transistor 110, the capacitor 120, the capacitor 121, the display element 130, the bank layer 157 and the organic insulating layer 164 may not be arranged in the second region 12. In addition, the film thickness of the planarization layer 150-2 of the second region 12 is smaller than the film thickness of the planarization layer 150-1 of the first region 11 (pixel 101). Therefore, it can be said that the entire thickness of the second region 12 is smaller than the entire thickness of the first region 11 (pixel 101).

(1-4. Folding a Display Device)

Figure 4A:
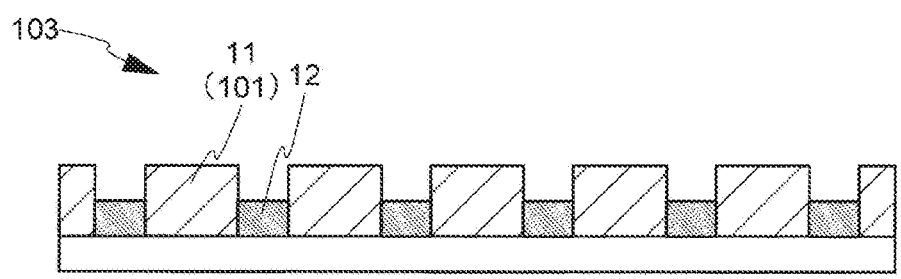
FIG. 4A is a cross-sectional diagram of the display device before folding of the display region.
Figure 4B:
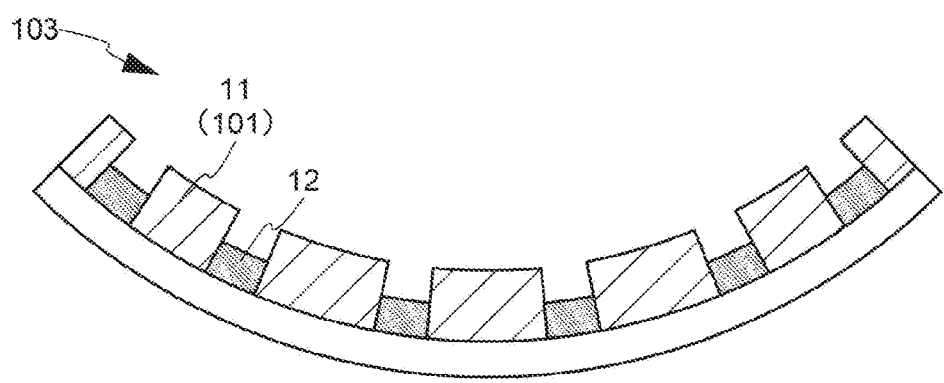
FIG. 4B is a cross-sectional diagram of the display device after folding of the display region.

Here, it is assumed that the display device 10 is folded. FIG. 4A is a cross-sectional schematic diagram of the display device 10 before folding of the display region 103. FIG. 4B is a cross-sectional schematic diagram of the display device 10 after folding of the display region 103. As is shown in FIG. 4A and FIG. 4B, a difference is arranged between the thickness of the first region 11 (pixel 101) and the thickness of the second region 12. In this way, compressive stress (strain) which is applied to the first region 11 (pixel 101) at the time of folding is dispersed by a space arranged by the second region 12. That is, it is difficult for a strain due to folding to be applied to the first region 11 (pixel 101). Therefore, the occurrence of defects in a pixel (for example, the occurrence of black spots due to film peeling) is suppressed. At this time, it can be said that the display region 103 includes redundancy with respect to folding. In the description above, the second region 12 may also be called a stress control region.

On the other hand, the second region 12 includes the sealing layer 161-2 stacked with the inorganic insulating layer 162 and the inorganic insulating layer 166. Therefore, as well as the first region 11 (pixel 101), the display region 103 which includes the second region 12 has a sufficient moisture blocking function. Therefore, the present invention suppresses deterioration of the display element 130 due to the entrance of moisture.

As described above, the present invention suppresses display defects even when the display device 10 is folded. That is, the display device 10 displays a good image without being affected by folding.

(1-5. Structure of Each Layer of Display Device)

In addition to the components described above, the display device 10 includes the substrate 100, an insulating layer 141, an insulating layer 149, an adhesive layer 195 and a substrate 200. Each layer which forms the transistor 110, the capacitor 120, the capacitor 121 and the display element 130 are also explained below.

An organic resin substrate is used for the substrate 100 and the substrate 200. The thickness of the organic resin substrate is not limited, but in the case when it is set to several μm or more and several tens of μm or less, it is possible to realize a sheet display having flexibility. In addition, the substrate 100 and the substrate 200 may require transparency in order to extract light emitted from the display element to the exterior. Since the substrate on the side from which emitted light is not extracted from the display element is not required to be transparent, a metal material may also be used in addition to the materials described above. A glass substrate may also be used in the case when the thickness is thin (for example, 50 μm or more and 200 μm or less).

The insulating layer 141 is arranged above the substrate 100 and has a function as an undercoat layer. In this way, the undercoat layer suppresses impurities, typically alkali metal, water or hydrogen and the like, from diffusing into the semiconductor layer 142 from the substrate 100.

The semiconductor layer 142 is arranged above the insulating layer 141. Silicon, an oxide semiconductor or an organic semiconductor and the like is used as the semiconductor layer 142.

The gate insulating layer 143 is arranged above the insulating layer 141 and the semiconductor layer 142. Silicon oxide, silicon oxynitride, silicon nitride, or an inorganic material having a high dielectric constant is used as the gate insulating layer 143.

The gate electrode 145a is arranged above the gate insulating layer 143. The gate electrode 145a is appropriately connected to the scanning line 145c. Furthermore, the gate electrode 145a and the capacitor electrode 145b are similarly arranged above the gate insulating layer 143. The gate electrode 145a and the capacitor electrode 145b may have a single layer structure of the conductive material described above or a stacked structure. In addition, it is preferred that the gate electrode 145a, the capacitor electrode 145b and the scanning line 145c have malleability and ductility. In this way, breaks at the time of folding are prevented. The gate electrode 145a, the capacitor electrode 145b and the scanning line 145c are formed from a conductive material selected from tantalum, tungsten, titanium, molybdenum and aluminum and the like.

The same material as the gate insulating layer 143 is used for the insulating layer 149. The insulating layer 149 is arranged above the gate insulating layer 143, the gate electrode 145a, the capacitor electrode 145b and the scanning line 145c. Furthermore, the insulating layer 149 may have a single layer or a stacked layer structure of the materials described above.

The source/drain electrode 147a is arranged above the insulating layer 149. The source/drain electrode 147a is appropriately connected to the signal line 147b. The same materials as those given as examples of the material of the gate electrode 145a are used for the source/drain electrode 147a. At this time, the same material as the gate electrode 145a may be used for the source/drain electrode 147a or a different material may also be used. Since other wirings are formed using the same conductive material in addition to the source/drain electrode 147a, the source/drain electrode 147a is required to have low resistance and good bonding properties with the semiconductor layer 142.

The conductive layer 153 is arranged above the planarization layer 150. The same material as the gate electrode 145a may be used or a different material may be used for the conductive layer 153. In addition to the conductive layer 153, not specifically shown in the diagram, other wiring bonded to the source/drain electrode 147a is also formed using the same conductive material. As a result, the conductive layer 153 is required to have low resistance and good bonding properties with a conductive material which forms the source/drain electrode 147a and the like.

The insulating layer 154 is arranged above the planarization layer 150 and the conductive layer 153. The same material as the gate insulating layer 143 is used for the insulating layer 154.

The pixel electrode 155 has a function as an anode of the display element 130. Furthermore, the pixel electrode 155 is preferred to have a property for reflecting light. Preferable as the former function is an oxide conductive material such as indium tin oxide (ITO) or indium zinc oxide (IZO), and preferable as the latter function is a conductive material with high surface reflectivity such as aluminum or silver. In order to satisfy both these functions, a stacked structure is adopted in which an oxide conductive layer is stacked above the conductive layer having high surface reflectivity. This oxide conductive layer is specifically ITO or IZO and the like. And the conductive layer is specifically aluminum or silver and the like.

The organic EL layer 159 is arranged above the pixel electrode 155. The organic EL layer 159 includes a light emitting material such as an organic electroluminescent material.

The counter electrode 160 has a function as a cathode of the display element 130. The counter electrode 160 is arranged to continuously cover the pixel electrode 155 across a plurality of pixel electrodes 155. The counter electrode 160 is arranged with a material having transparency and conductivity in order to allow light emitted by the organic EL layer 159 to pass through.

Transparency is required for the counter electrode 160 and at the same time, reflectivity is required for forming a microcavity between the counter electrode 160 and the reflective surface of the pixel electrode 155. As a result, the counter electrode 160 is formed as a semi-transparent film. Specifically, a layer comprised from silver, magnesium or an alloy thereof is formed to a film thickness which allows light to pass through.

An inorganic material, an organic material or a composite material of an organic material and an inorganic material is used for the adhesive layer 195. For example, an acrylic resin is used for the adhesive layer 195.

(1-6. Manufacturing Method of Display Device)

A method of manufacturing the display device 10 is explained below using FIG. 5 to FIG. 11.

(1-6-1. Formation of Transistor)

First, as is shown in FIG. 5 and FIG. 6, after the insulating layer 141, the semiconductor layer 142 and the gate insulating layer 143 on a first surface (upper surface when viewed in a cross-sectional direction) of the substrate 100, the gate electrode 145a is formed above the gate insulating layer 143. Each layer is processed into a predetermined shape using a photolithography method, a nanoimprinting method, an inkjet method or an etching method and the like as appropriate.

For example, in the case when an organic resin substrate is used as the substrate 100, a polyimide substrate is used.

The insulating layer 141 is formed using a material such as silicon oxide, silicon oxynitride or silicon nitride and the like. The insulating layer 141 may have a single layer or stacked layers. The insulating layer 141 is formed by a CVD method, a spin coating method or a printing method and the like.

In the case when a silicon material is used as the semiconductor layer 142, for example, amorphous silicon or polycrystalline silicon and the like is used. In addition, in the case where an oxide semiconductor is used as the semiconductor layer 142, a metal material such as indium, gallium, zinc, titanium, aluminum, tin or cerium and the like is used. For example, it is possible to use an oxide semiconductor (IGZO) having indium, gallium or zinc. The semiconductor layer 142 is formed by a sputtering method, an evaporation method, a plating method or a CVD method and the like. As is shown in FIG. 5, it is not necessary for the semiconductor layer 142 to be formed in the second region 12.

An insulating film including one or more from silicon oxide, silicon oxynitride, silicon nitride, silicon oxynitride, aluminum oxide, magnesium oxide or hafnium oxide or the like is used as the gate insulating layer 143. It is possible to form the gate insulating layer 143 using the same method as the insulating layer 141.

The gate electrode 145a is formed using a metal element selected from tungsten, aluminum, chromium, copper, titanium, tantalum, molybdenum, nickel, iron, cobalt, tungsten, indium and zinc, or an alloy with the metal elements described above as a component, or an alloy in which the metal elements described above are combined. In addition, a material including nitrogen, oxygen or hydrogen and the like may be used in the materials described above for the gate electrode 145a. For example, stacked films of an aluminum (Al) layer and a titanium layer (Ti) formed by a sputtering method are used as the gate electrode 145a.

Furthermore, as is shown in FIG. 6, the capacitor electrode 145b and the scanning line 145c are formed at the same time as the gate electrode 145a.

Next, the insulating layer 149 is formed above the gate insulating layer 143, the gate electrode 145a, the capacitor electrode 145b, and the scanning line 145c. The same material and method as those of the gate insulating layer 143 are used for the insulating layer 149. For example, a silicon oxide film formed using a plasma CVD method is used as the insulating layer 149.

Figure 7:
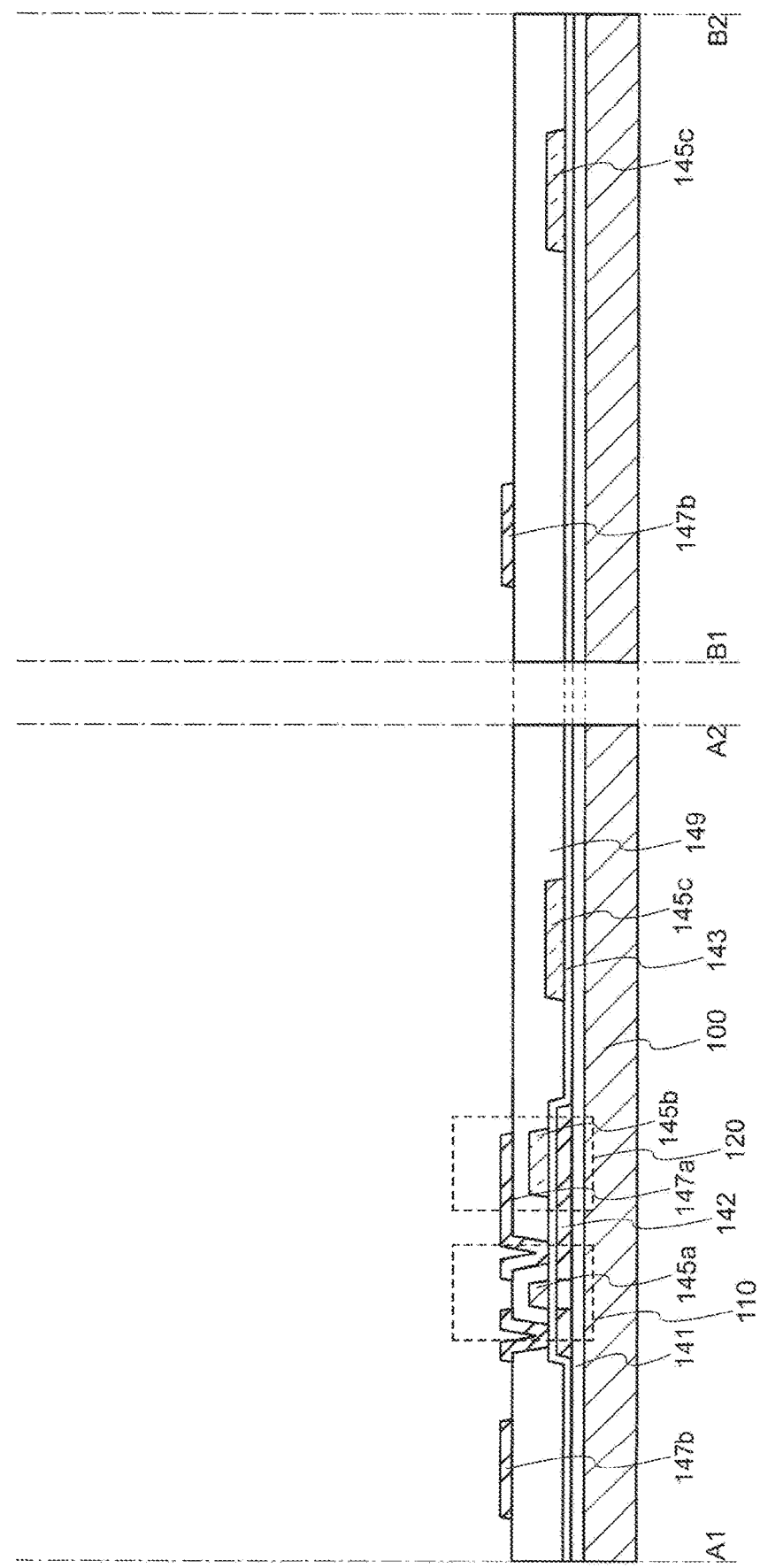
FIG. 7 is a cross-sectional diagram showing the manufacturing method for the display device in an embodiment according to the present invention.

Next, as is shown in FIG. 7, the source/drain electrode 147a is formed above the insulating layer 149. It is possible to use the same material and method as those of the gate electrode 145a for the source/drain electrode 147a. The source/drain electrode 147a is formed after forming an opening part in the insulating layer 149 and is connected to the source/drain region of the semiconductor layer 142. Furthermore, at this time, the signal line 147b is simultaneously formed.

Figure 8:
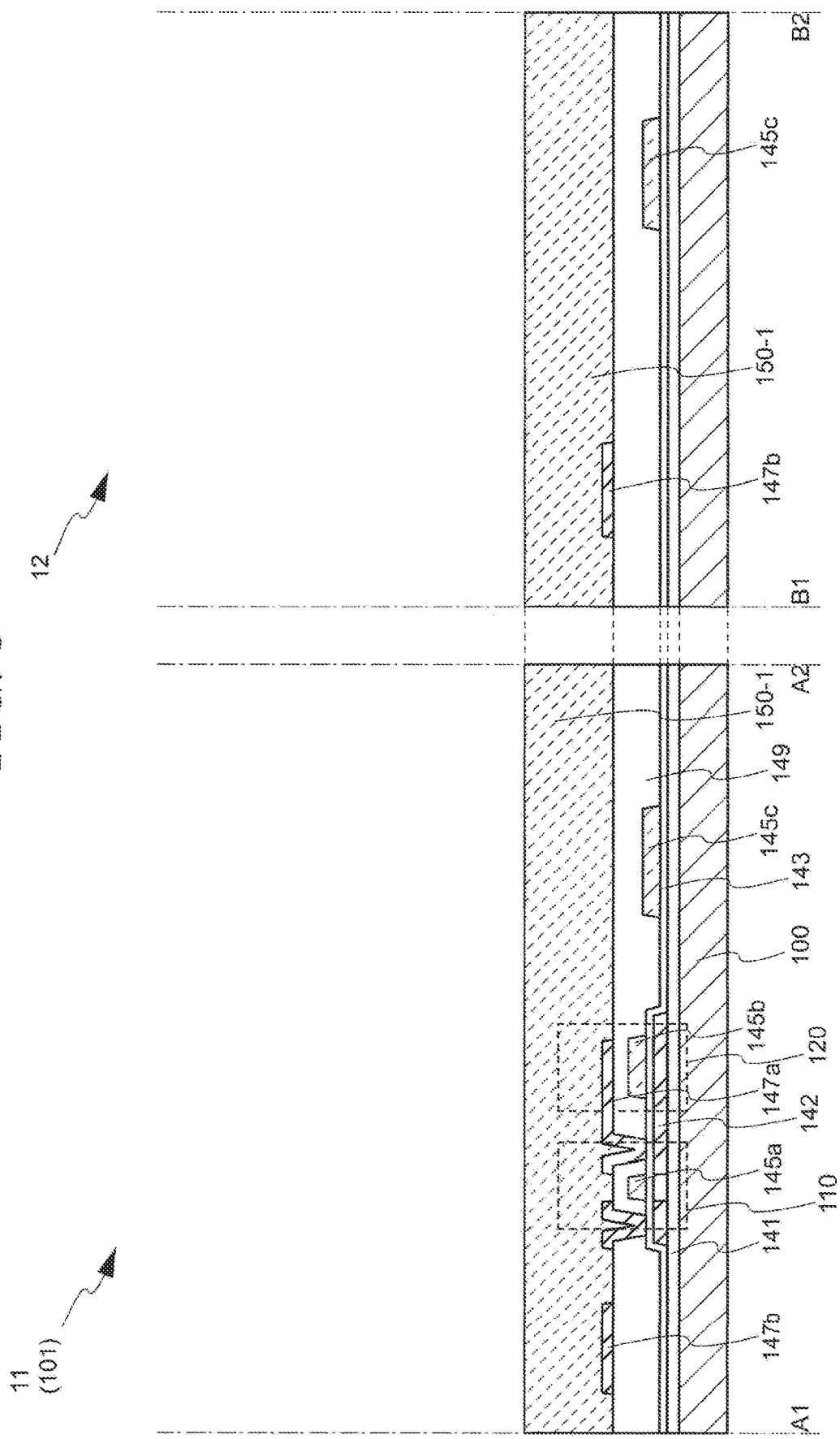
FIG. 8 is a cross-sectional diagram showing the manufacturing method for the display device in an embodiment according to the present invention.

Next, as is shown in FIG. 8, the planarization layer 150-1 is formed above the insulating layer 149 and the source/drain electrode 147a. An organic insulating material such as an acrylic resin, an epoxy resin or a polyimide and the like is used as the planarization layer 150-1. It is possible to form the planarization layer 150-1 using a spin coating method, a printing method and an inkjet method or the like. For example, it is possible to use an acrylic resin formed by a spin coating method as the planarization layer 150-1. The planarization layer 150-1 is formed to an extent such that its upper surface becomes flat.

Figure 9:
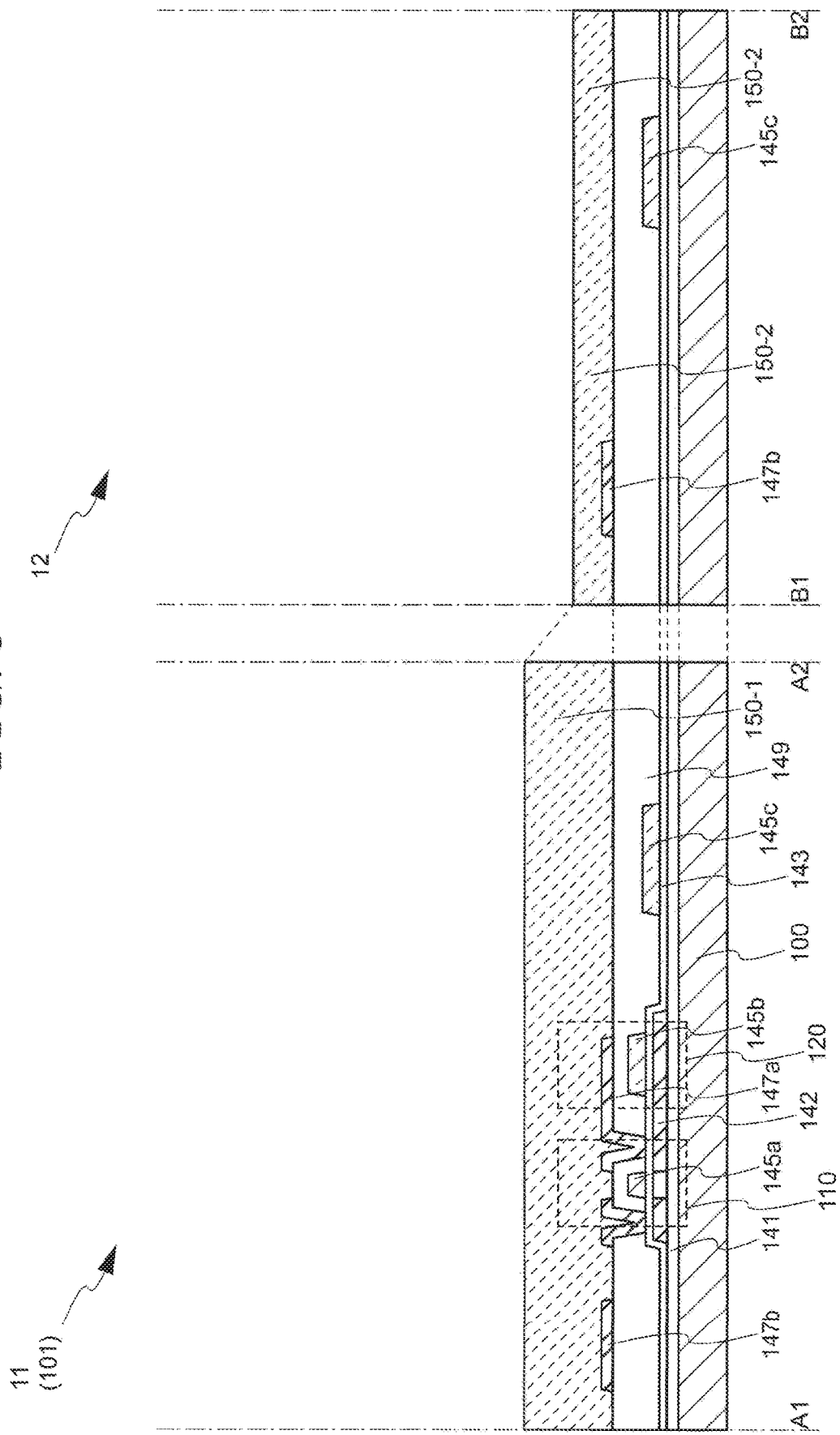
FIG. 9 is a cross-sectional diagram showing the manufacturing method for the display device in an embodiment according to the present invention.

Next, as is shown in FIG. 9, in the second region 12, the planarization layer 150-1 is processed in order to reduce the film thickness of the planarization layer 150-1 (for example, until it is 1 μm or less). At this time, the planarization layer 150-1 is formed using photolithography and etching. In the case when the planarization layer 150-1 includes a photosensitive material, it is possible to use only the photolithography method. As a result, the planarization layer 150-2 is formed in the second region 12.

(1-6-2. Formation of Display Element)

Figure 10:
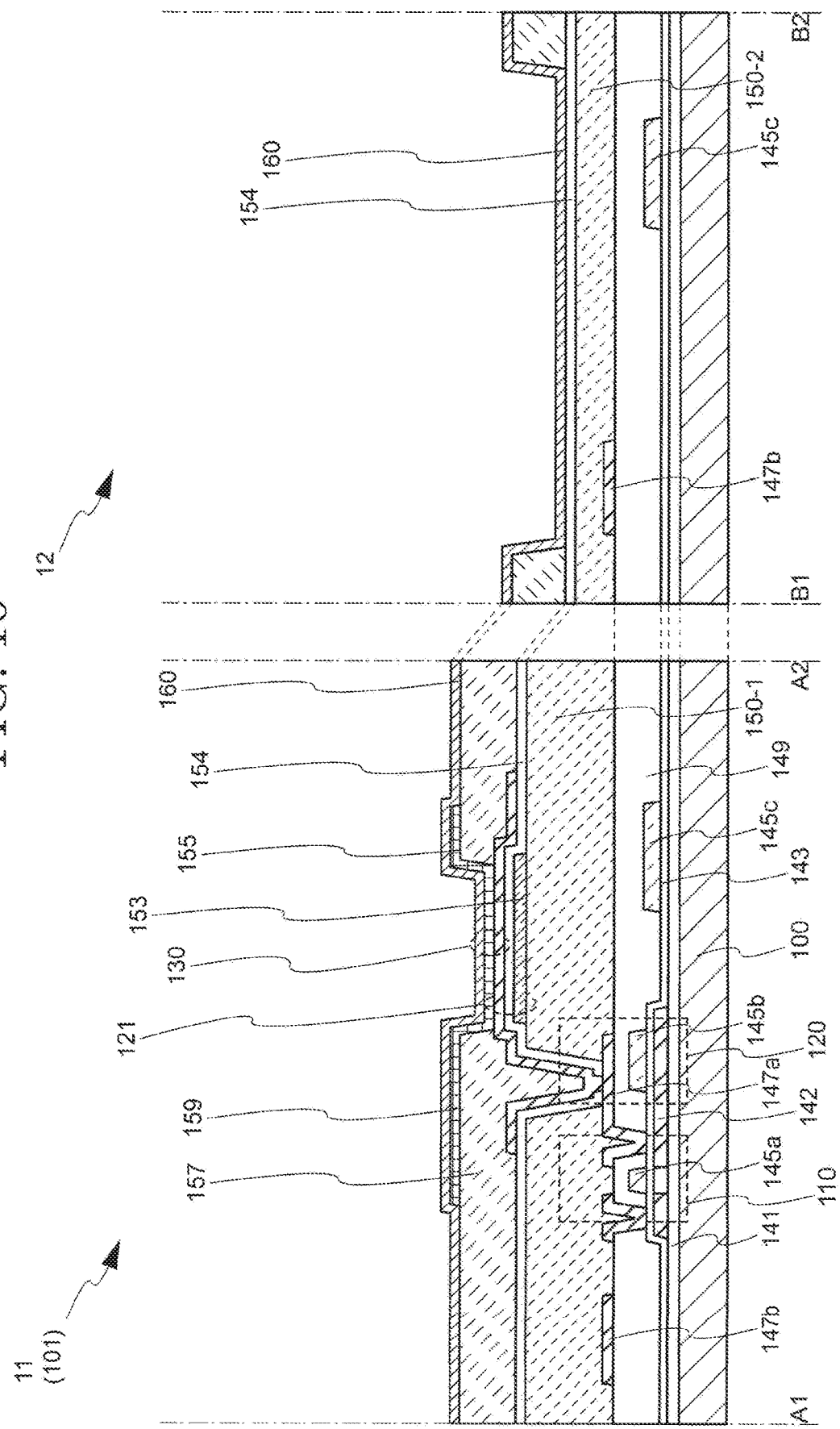
FIG. 10 is a cross-sectional diagram showing the manufacturing method for the display device in an embodiment according to the present invention.

Next, as is shown in FIG. 10, a capacitor element 121 (formed by the conductive layer 153, the insulating layer 154 and the pixel electrode 155), the display element 130 (formed by the pixel electrode 155, the organic EL Layer 159 and the counter electrode 160) and the bank layer 157 are formed above the planarization layer 150-1. Each layer is processed into a predetermined shape using a photolithography method, a nano-imprinting method, an inkjet method or an etching method and the like as appropriate.

First, the conductive layer 153 is formed above the planarization layer 150-1. It is possible to form the conductive layer 153 using the same material and method as those of the gate electrode 145a. For example, a stacked film of molybdenum, aluminum, and molybdenum formed by a sputtering method is used as the conductive layer 153.

Next, the insulating layer 154 is formed above the conductive layer 153. The insulating layer 154 is formed using the same material and method as those of the gate insulating layer 143. For example, a silicon nitride film formed using a plasma CVD method is used as the insulating layer 154. Furthermore, it is not necessary that the insulating layer 154 is processed. At this time, the insulating layer 154 is also formed in the second region 12.

Next, the pixel electrode 155 is formed above the insulating layer 154 in the first region 11 (pixel 101). For example, a metal material with light reflecting properties such as aluminum (Al) or silver (Ag) may be used for the pixel electrode 155, or a structure in which a transparent conductive layer made from indium tin oxide (ITO) or indium zinc oxide (IZO) having excellent hole injection properties and a metal layer having light reflecting properties may be stacked. The pixel electrode 155 is formed using the same method as the gate electrode 145a. For example, a stacked film of ITO, silver, and ITO formed by a sputtering method is used as the pixel electrode 155.

Next, the bank layer 157 is formed above the insulating layer 154 and the pixel electrode 155 in the first region 11 (pixel 101). An opening is formed in the bank layer 157 to expose the upper surface of the pixel electrode 155. An end part of the pixel electrode 155 is covered by the bank layer 157. For example, a polyimide film formed by a spin coating method is used as the bank layer 157. At this time, a polyimide film in the second region 12 is removed except for one part as is shown in FIG. 10.

Next, the organic EL layer 159 is formed above the pixel electrode 155 and the bank layer 157 in the first region 11 (the pixel 101). The organic EL layer 159 is formed using a low molecular weight or high molecular weight organic material. In the case where a low molecular weight organic material is used, in addition to the light emitting layer which includes a light emitting organic material, the organic EL layer 159 may also include a hole injecting layer or an electron injecting layer, a hole transporting layer or an electron transport layer and the like.

In addition, the organic EL layer 159 is formed so as to overlap at least the pixel electrode 155. The organic EL layer 159 is formed by a vacuum deposition method, a printing method or a spin coating method and the like. In the case where the organic EL layer 159 is formed by a vacuum evaporation method, a shadow mask may be used as appropriate whereby a region is arranged where no film is formed. The organic EL layer 159 may also be formed using a material different from that of adjacent pixel or the same organic EL layer 159 may be used in all pixels.

Next, the counter electrode 160 is formed so as to bridge across the pixel electrode 155 and the organic EL layer 159 in the first region 11 (pixel 101). It is possible to use a transparent conductive film such as indium tin oxide (ITO) or indium zinc oxide (IZO), or an alloy of silver (Ag) and magnesium can be used for the counter electrode 160. In addition, it is possible to form the counter electrode 160 by a vacuum deposition method or a sputtering method. For example, an alloy film of silver (Ag) and magnesium formed by a vapor deposition method is used as the counter electrode 160. Furthermore, the counter electrode 160 may be formed without processing. At this time, the counter electrode 160 is also formed in the second region 12 as is shown in FIG. 10.

(1-6-3. Formation of Sealing Layer)

Figure 11:
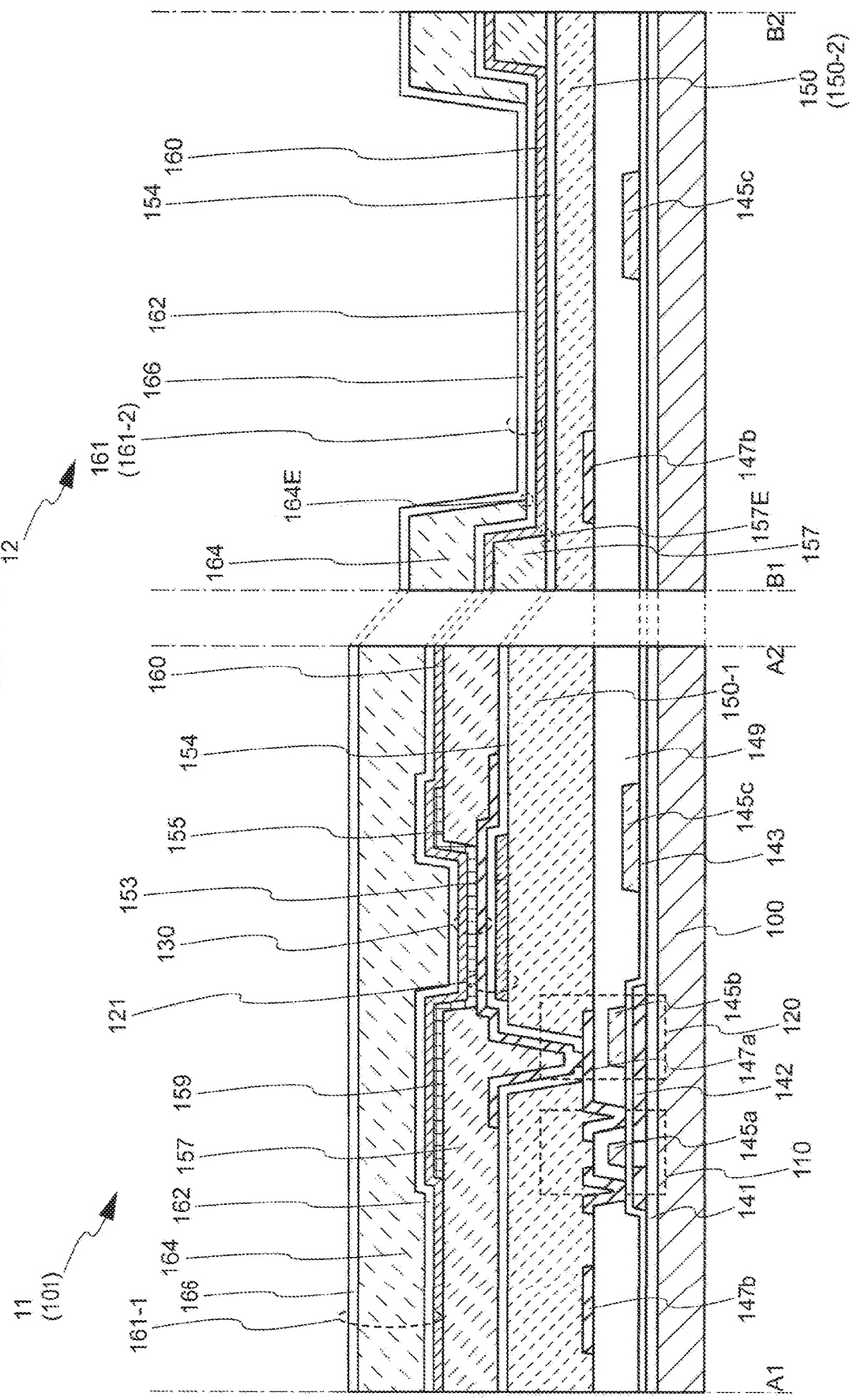
FIG. 11 is a cross-sectional diagram showing the manufacturing method for the display device in an embodiment according to the present invention.

Next, as is shown in FIG. 11, an inorganic insulating layer 162, an organic insulating layer 164 and an inorganic insulating layer 166 which make up the sealing layer 161-1 are formed in order above the counter electrode 160 in the first region 11 (pixel 101). One or more inorganic or organic layers may be further formed between the inorganic insulating layer 162 and the inorganic insulating layer 166. In addition, the inorganic insulating layer 162 and the inorganic insulating layer 166 which make up the sealing layer 161-2 are formed in order above the counter electrode 160 in the second region 12. The sealing layer 161-1 and the sealing layer 161-2 cover the entire surface of the display region 103.

An insulating film including at least one type of aluminum oxide, silicon oxide or silicon nitride and the like is used for the inorganic insulating layer 162 and the inorganic insulating layer 166. The inorganic insulating layer 162 and the inorganic insulating layer 166 are formed by a plasma CVD method, a thermal CVD method, an evaporation method, a spin coating method, a spraying method or a printing method. For example, it is possible to use a stacked film of a silicon nitride film and a silicon oxide film formed by a plasma CVD method for the inorganic insulating layer 162 and the inorganic insulating layer 166. The thickness of the inorganic insulating layer 162 and the inorganic insulating layer 166 may be set to 50 nm or more and 200 nm or less.

A material such as acrylic, polyimide or epoxy and the like can be used for the organic insulating layer 164. In addition, in this example the organic insulating layer 164 is formed by an inkjet method. By using the inkjet method, it is possible to selectively form an organic insulating layer only in the first region 11 (pixel 101) without being formed in the second region 12. Furthermore, the method is not limited to an inkjet method and a spin coating method, a vapor deposition method, a spray method or a printing method and the like may also be used. Although the film thickness of the organic insulating layer 164 is not limited, for example, the film thickness may be 5 µm to 20 µm.

(1-6-4. Adhesion with Counter Substrate)

Lastly, as is shown in FIG. 11, the substrate 200 which becomes the counter substrate is bonded to the substrate 100 using the adhesive layer 195. For example, an epoxy resin or an acrylic resin and the like can be used as the adhesive layer 195.

Figure 12:
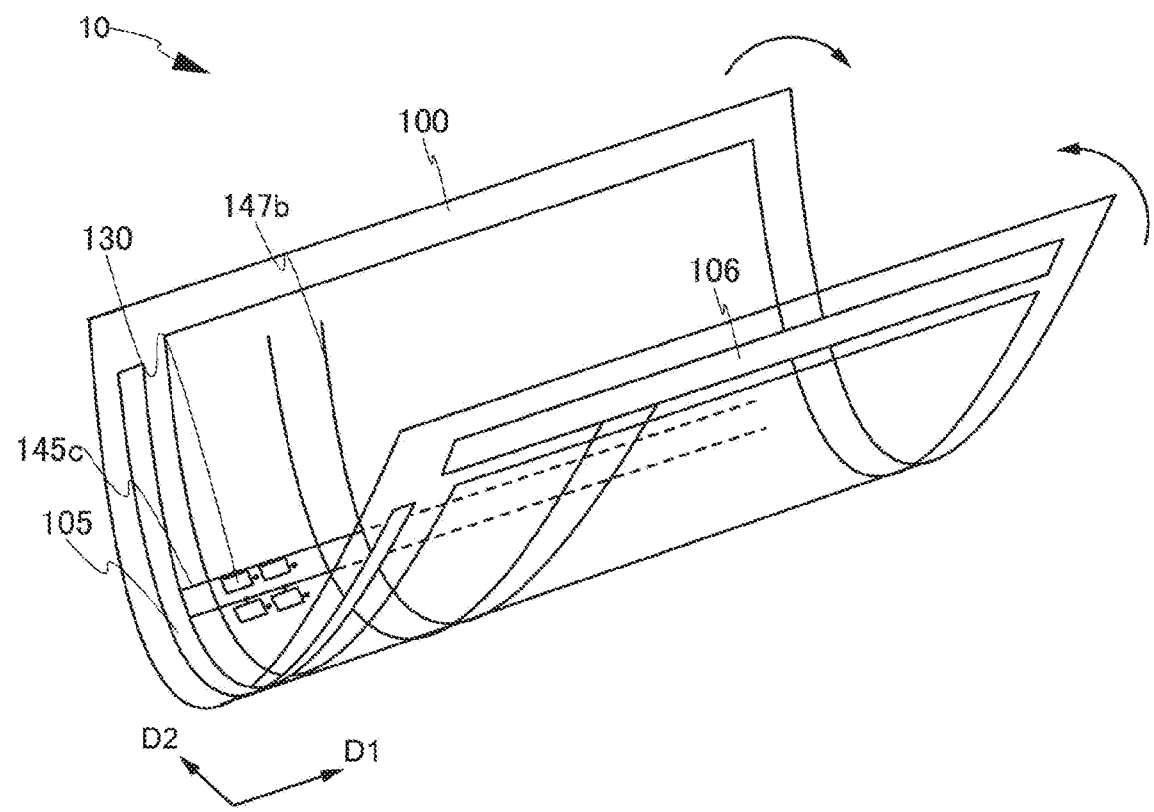
FIG. 12 is a perspective view diagram showing the display device in an embodiment according to the present invention.

FIG. 12 is a perspective diagram of the display device 10 when folded. As is shown in FIG. 12, by using the structure and method described above, the display device 10 does not require that the planarization layer and the sealing layer be processed together with the substrate. That is, the manufacturing process of the display device is simplified. In addition, display defects are suppressed even when the display device 10 is folded. That is, the display device can display a good image without being affected by folding.

Modification Example 1

As another application example, the present invention is applicable to not only an organic EL display but also a liquid crystal display device, other self-light emitting display devices, or electronic paper type display devices including an electrophoretic display element and the like, or any flat panel type display device. In addition, the present invention is applied from medium to small size to large size applications without any particular limitations.

Modification Example 2

Figure 13:
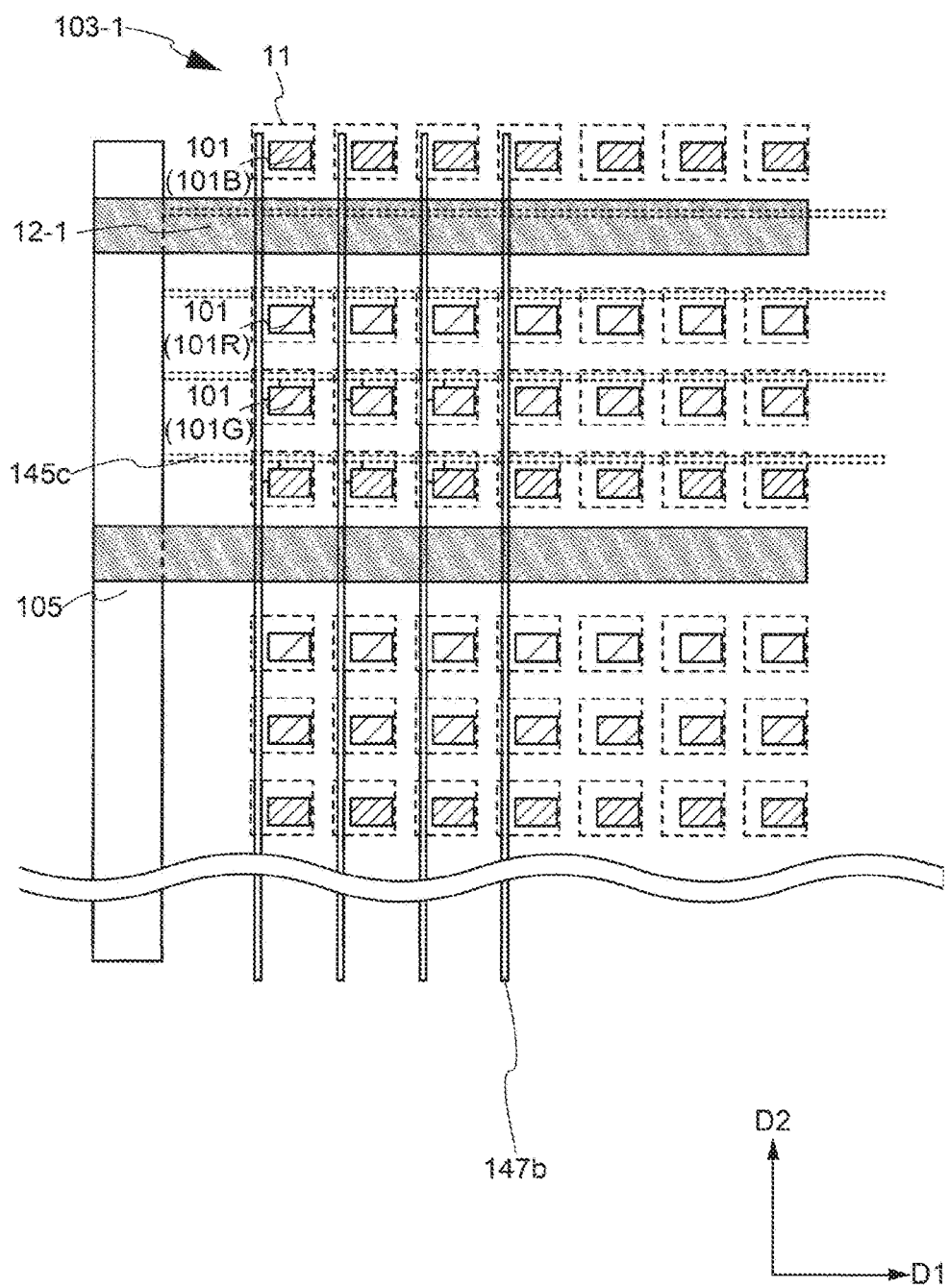
FIG. 13 is a planar view diagram showing a modification example of the display region in an embodiment according to the present invention.

In one embodiment of the present invention, although an example is shown in which the second region 12 is arranged in the first direction D1, the present invention is not limited thereto. FIG. 13 is a top surface diagram of the display region 103-1. As is shown in FIG. 13, the second region 12-1 may be arranged to extend in the first direction D1. At this time, the second region 12-1 may also be arranged in the drive circuit 106. In this way, the drive circuit can also be easily folded. Therefore, the display device can be more easily folded.

Modification Example 3

Figure 14:
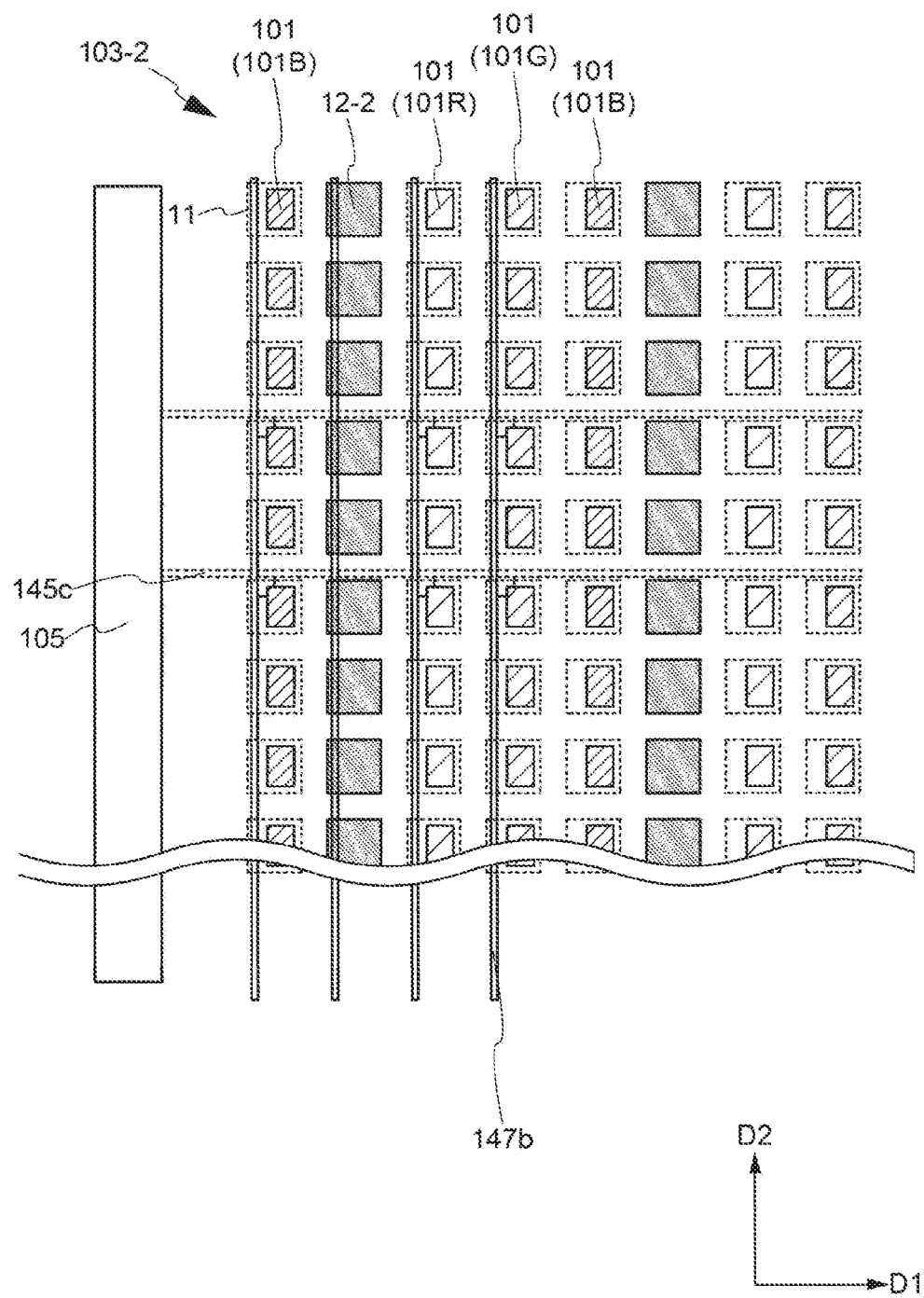
FIG. 14 is a planar view diagram showing a modification example of the display region in an embodiment according to the present invention.
Figure 15:
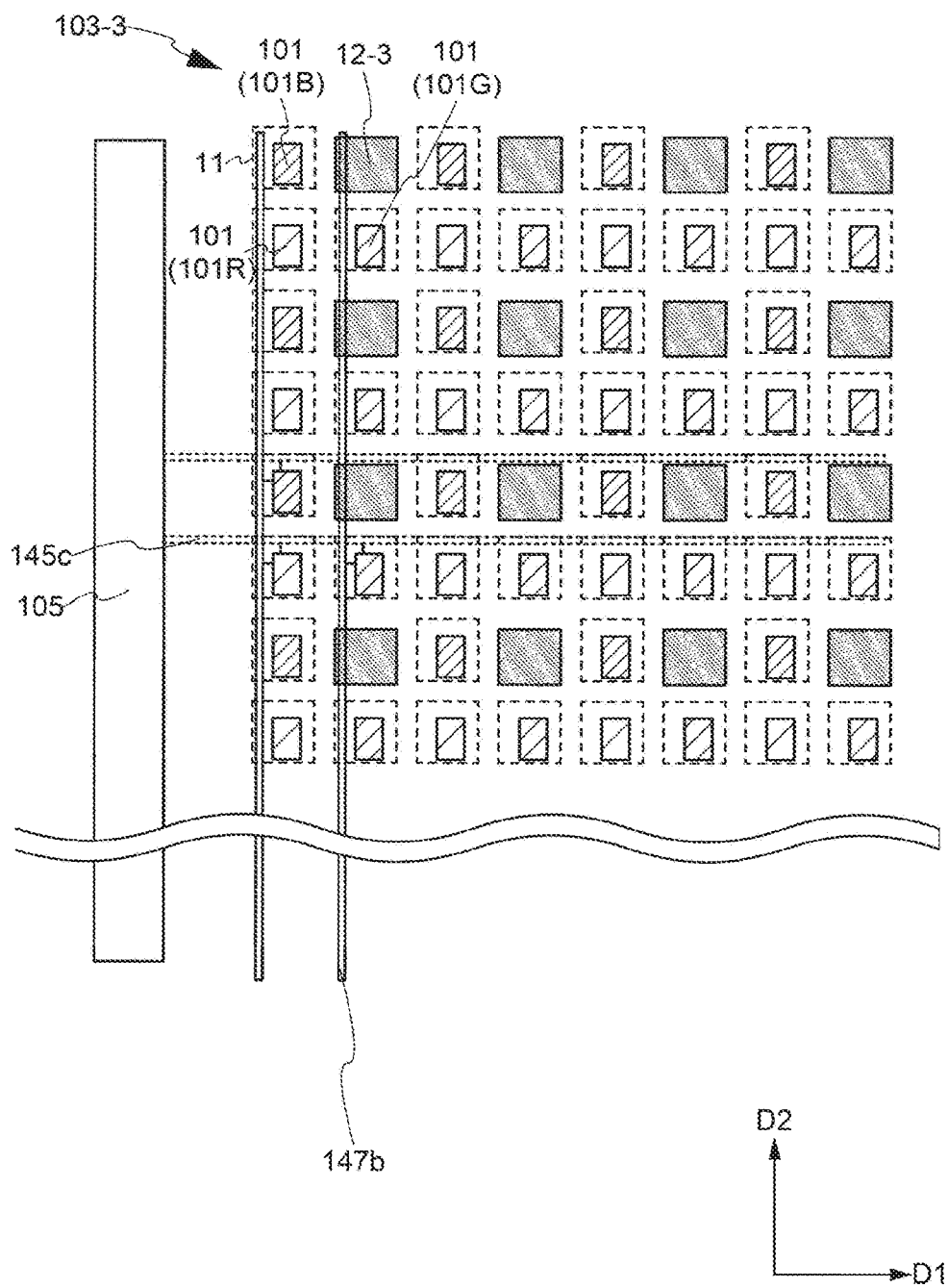
FIG. 15 is a planar view diagram showing a modification example of the display region in an embodiment according to the present invention.

In one embodiment of the present invention, although an example is shown in which the second region 12 is arranged along in the first direction, the present invention is not limited thereto. FIG. 14 is a top surface diagram of the display region 103-2. The second region 12-2 may be arranged along the second direction D2. FIG. 15 is a top surface diagram of the display region 103-3. As is shown in FIG. 15, the second region 12-3 may not be arranged in one direction but may be arranged in a lattice shape similar to the first region 11 (pixels 101). In this way, the display device can be freely folded.

Modification Example 4

Figure 16:
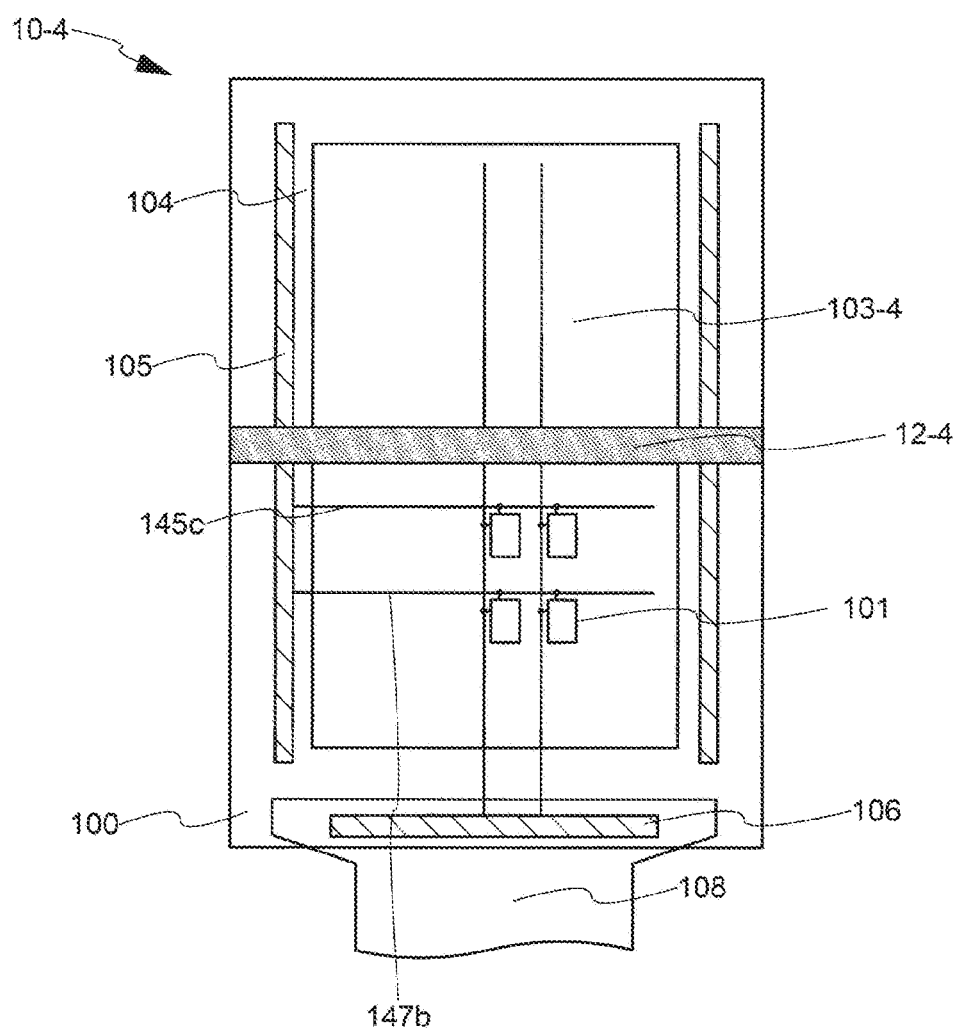
FIG. 16 is a planar view diagram showing a modification example of the display device in an embodiment according to the present invention.

In one embodiment of the present invention, although an example shown which one display region 103 is arranged, the present invention is not limited thereto. FIG. 16 is a top surface diagram of the display device 10-4. The second region 12-4 is arranged at the center of the display device 10-4. The display region 103-4 may also be arranged on both sides of the second region 12-4. At this time, the drive circuit 105 may be arranged in a region which overlaps with the second region 12-4 the same as in FIG. 13 and the like.

Modification Example 5

Figure 17:
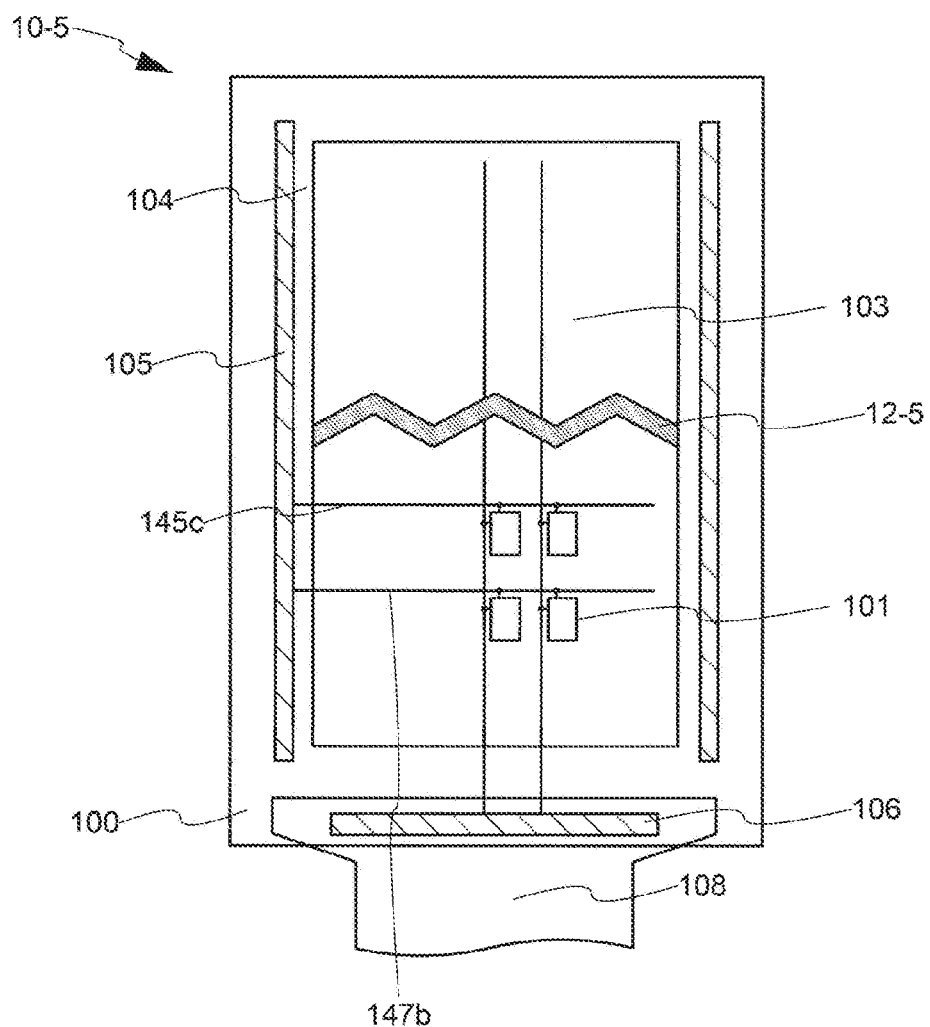
FIG. 17 is a planar view diagram showing a modification example of the display device in an embodiment according to the present invention.
Figure 18:
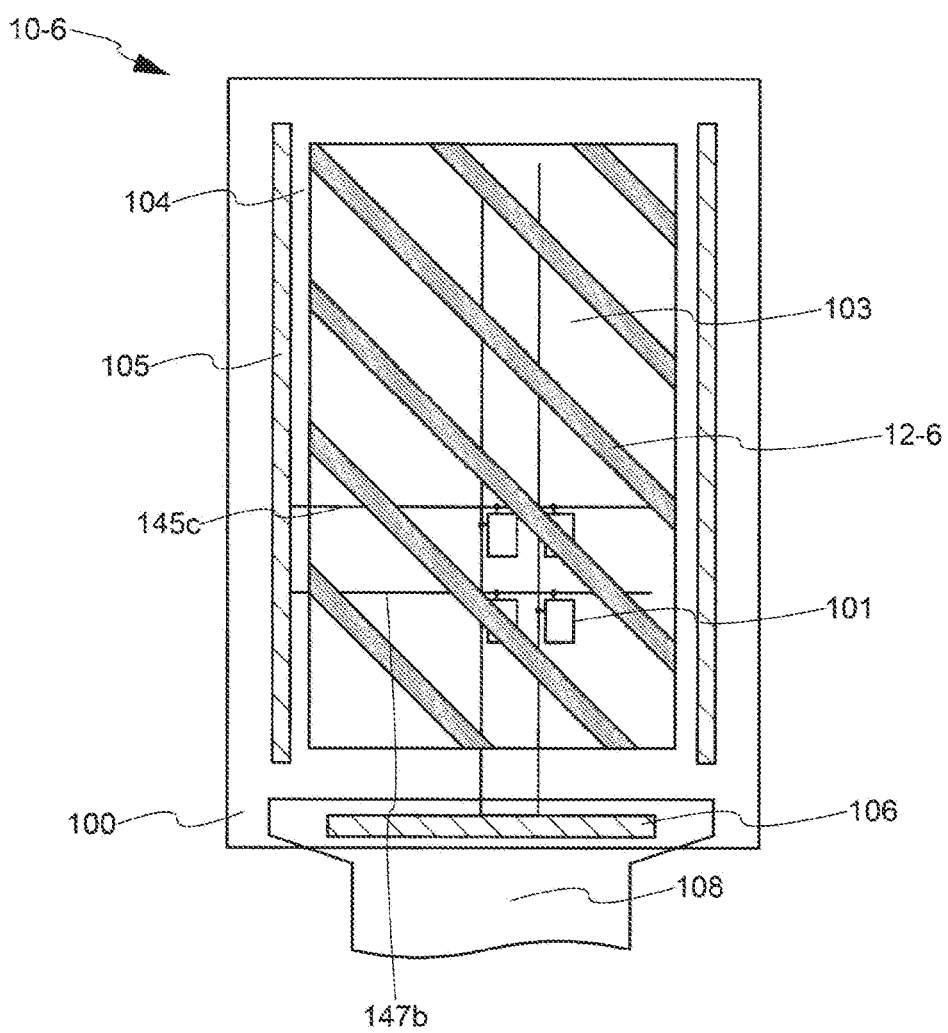
FIG. 18 is a planar view diagram showing a modification example of the display device in an embodiment according to the present invention.

In one embodiment of the present invention, as in the display device 10-5 of FIG. 17 and the display device 10-6 of FIG. 18, the second region 12 is arranged in a diagonal direction. By making the second region 12 similar to the second region 12-5 in FIG. 17, it is possible to relieve the stress from a plurality of directions applied to a pixel close to a folding position. In addition, as in the second region 12-6 of FIG. 18, the folding direction may be set to be diagonal. The second region 12 may be arranged according to an arbitrary folding direction, or a plurality of folding directions may be aligned and a group of second regions 12 may be made to intersect. Furthermore, if the folding point is one place, the second region 12-5 may be arranged concentrated on the folding position as is shown in FIG. 17. If the folding portion is arranged in the entire display region, the second region 12-6 may be arranged as a whole as is shown in FIG. 18.

Modification Example 6

Figure 19:
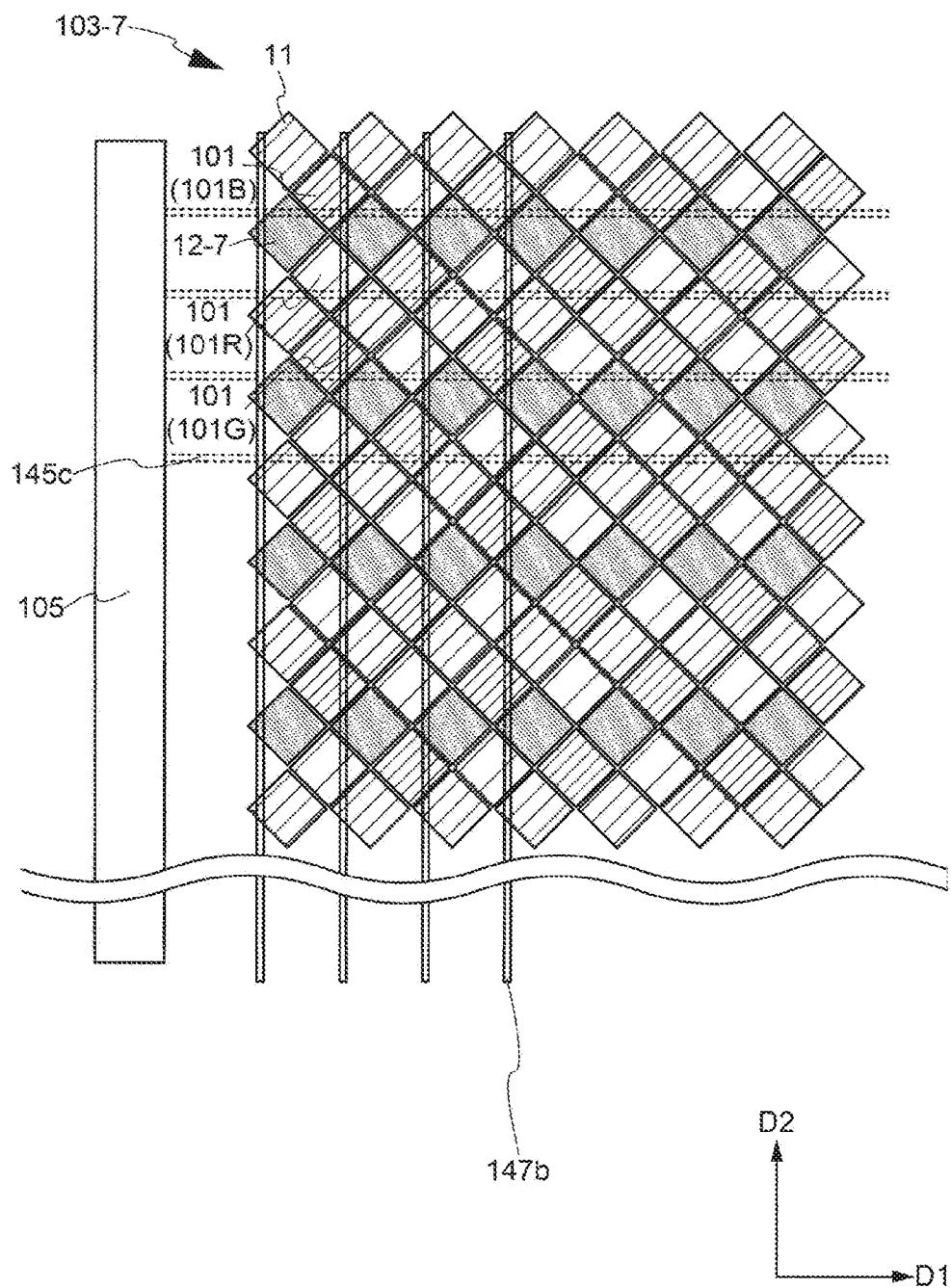
FIG. 19 is a planar view diagram showing a modification example of the display region in an embodiment according to the present invention.

In one embodiment of the present invention, a pixel is arranged in a diagonal direction similar to the display region 103-7 shown in FIG. 19. The arrangement of the second region 12-7 can be applied with the same arrangements as in the modification examples 1 to 5.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:

1. A display device comprising:
a display region including a plurality of first regions, and a plurality of second regions arranged with a certain gap between the plurality of first regions;
wherein
one of the plurality of second regions is in between two of the plurality of the first regions, each of the plurality of first regions includes a transistor, a first planarization layer on the transistor, a wiring, a first organic insulating layer on the wiring and the transistor, a display element on the first organic insulating layer, and a first sealing layer on the display element and stacked in order with a first inorganic insulating layer, a second organic insulating layer and a second inorganic insulating layer, each of the plurality of second regions includes the wiring, a second planarization layer on the wiring, a second sealing layer stacked in order with the first inorganic insulating layer and the second inorganic insulating layer,
the first planarization layer includes an organic resin,
the second planarization layer includes an organic resin,
the first planarization layer has a first thickness, the first thickness is a constant thickness of a first area where the first planarization layer is located without overlapping with the transistor and the wiring,
the second planarization layer has a second thickness, the second thickness is a constant thickness of a second area where the second planarization layer is located without overlapping with the transistor and the wiring,
the second thickness is smaller than the first thickness,
each of the plurality of first regions includes a light emitting region where the display element emits light, and each of the plurality of second regions is a non-light emitting region,
the plurality of second regions are arranged along a first direction of the display region,
the plurality of first regions are arranged parallel along the first direction,
the first direction is parallel to the short side of the display device,
the plurality of first regions are arranged continuously in three or more in the second direction, and
the plurality of second regions are repeatedly arranged at intervals of three or more first regions in the second direction.

2. The display device according to claim 1, wherein the thickness of the second sealing layer is smaller than the thickness of the first sealing layer.

3. The display device according to claim 1, wherein the second thickness is 50% or less than the first thickness.

4. The display device according to claim 3, wherein the second thickness is 1 μm or less.

5. The display device according to claim 1, wherein at least one of the first inorganic insulating layer and the second inorganic insulating layer is a silicon nitride layer.

6. The display device according to claim 5, wherein a thickness of the first inorganic insulating layer and the second inorganic insulating layer is 50 nm or more and 200 nm or less.

7. The display device according to claim 6, wherein a thickness of the second organic insulating layer is 5 μm or more and 20 μm or less.

8. The display device according to claim 1 wherein the display element includes an organic EL element.

9. The display device according to claim 1, wherein the wiring has malleability and ductility.

10. The display device according to claim 9, further comprising:
a substrate having flexibility.

11. The display device according to claim 1, wherein the plurality of second regions is arranged in a lattice shape.

12. The display device according to claim 1, further comprising an insulating layer, wherein
the transistor includes a source electrode and a drain electrode on the insulating layer,
a bottom surface of the first planarization layer is in contact with the insulating layer at the first area, and
a bottom surface of the second planarization layer is in contact with the insulating layer at the second area.

13. The display device according to claim 12, wherein a top surface of the second planarization layer at the second area is lower than a top surface of the first planarization layer at the first area.

* * * * *